(12) United States Patent
Sim

(10) Patent No.: US 7,723,222 B2
(45) Date of Patent: May 25, 2010

(54) METHOD OF FABRICATING FLASH MEMORY DEVICE

(75) Inventor: Cheon Man Sim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 194 days.

(21) Appl. No.: 11/932,088

(22) Filed: Oct. 31, 2007

(65) Prior Publication Data

US 2008/0157166 A1 Jul. 3, 2008

(30) Foreign Application Priority Data

Dec. 29, 2006 (KR) .................. 10-2006-0137278

(51) Int. Cl.
*H01L 21/70* (2006.01)
(52) U.S. Cl. .................. 438/585; 438/595; 438/184; 438/230; 438/303
(58) Field of Classification Search .................. 438/595
See application file for complete search history.

(56) References Cited

U.S. PATENT DOCUMENTS 5,863,820 A * 1/1999 Huang .................. 438/241
6,531,353 B2 * 3/2003 Lee .................. 438/210
6,753,222 B2 * 6/2004 Mimuro et al. .................. 438/257

OTHER PUBLICATIONS

Chian-Yu, Sin et al, Photoresist Trimming in Oxygen-Based High-Density Plasmas: Effect of HBr and Cl2 Addition to CF4/O2 Mixture, Oct. 23, 2003, American Chemical Society, 2003 42, 6080-6087.*

* cited by examiner

*Primary Examiner*—Thanh V Pham
*Assistant Examiner*—Mohammad Choudhry
(74) *Attorney, Agent, or Firm*—Sherr & Vaughn, PLLC

(57) ABSTRACT

A flash memory device including a cell region and a logic region formed over a semiconductor substrate; a pair of stacked gates formed spaced apart over the cell region; a pair of first spacers formed over the cell region in direct contact with at least one side of the stacked gates; a pair of gate electrodes formed spaced apart over the logic region; a pair of second spacers formed over the logic region in direct contact with at least one side of the gate electrodes; a first photoresist layer formed over the cell area between the first spacers and a second photoresist layer formed over the logic area between the second spacers, the second photoresist layer having a predetermined thickness sufficient to protect the second spacers.

17 Claims, 4 Drawing Sheets

METHOD OF FABRICATING FLASH MEMORY DEVICE

The present application claims priority under 35 U.S.C. 119 to Korean Patent Application No. 10-2006-0137278 (filed on Dec. 29, 2006), which is hereby incorporated by reference in its entirety.

BACKGROUND

A flash memory device is a non-volatile memory device, and thus, differs from other memory devices such as dynamic RAM (DRAM) or static RAM (SRAM) since it does not lose its memorized data in spite of being turned off. This feature makes the flash memory differ from.

In accordance with a cell array system, a flash memory device can be categorized into either an NOR type structure or a NAND structure. The NOR structure has cells aligned in parallel between a bit line and a ground while the NAND structure has cells aligned in series. The NOR flash memory enables a high-speed random access in performing a read operation, and thus, is widely used for mobile phone booting. On the other hand, the NAND flash memory device has a slow read speed and a fast write speed, and thus, is suitable for data storage and advantageous in downsizing.

In accordance with a structure of a unit cell, the flash memory can be categorized into a stacked gate type or a split gate type. According to a shape of a charge storage layer, the flash memory can be categorized into a floating gate device and an SONOS (Silicon-Oxide-Nitride-Oxide-Silicon) device.

The floating gate device can include a floating gate formed of polysilicon surrounded by an insulator. Electric charges may be injected into the floating gate using channel hot carrier injection or discharged from the floating gate using Fowler-Nordheim tunneling. Thus, data can be stored or erased.

In 90 nm or below NOR flash memory device, a pre-metal dielectric (PMD) gap-fill process is very important. Since a spatial gap between gates may be very small, if spacers are provided to both sides of the gates, a PMD layer has a problem with voids. Therefore, it may be difficult to perform normal gap-filling. This void problem may enable the voids to be filled with a metallic substance such as tungsten and the like for filling a contact hole to electrically connect a first metal layer of a multilayered structure. Accordingly, the NOR flash memory device enables drains to be electrically connected using tungsten formed using CVD, thereby bringing about device failure.

Figure 1:
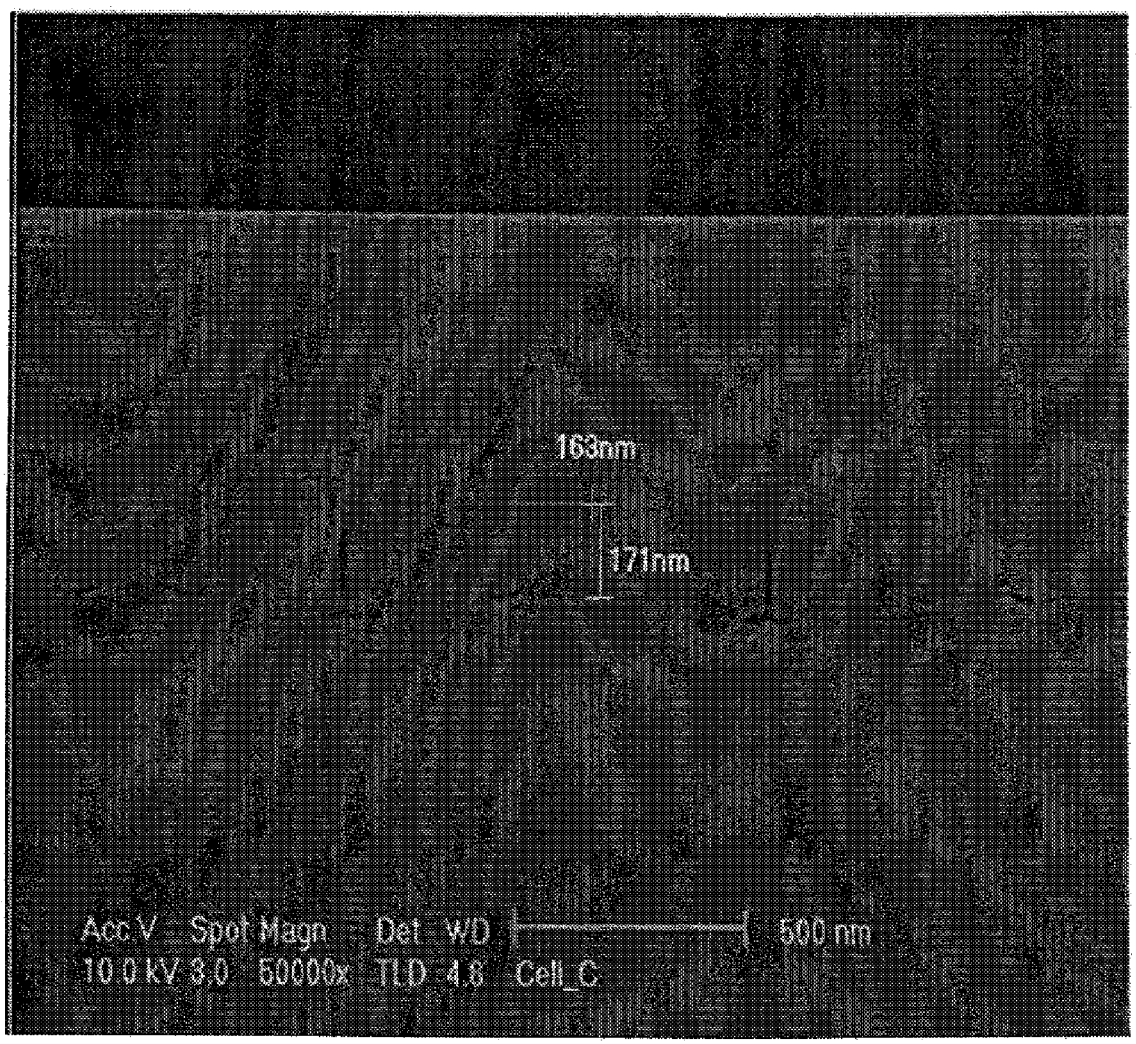

As illustrated in example FIG. 1, a scanning electron microscope (SEM) image of a of 130 nm flash memory device in which a void-free normal gap-fill in PMD deposition is conducted.

As illustrated in example FIG. 2, if deposition of a 90 nm or below flash process is performed under the same processing conditions of the 130 nm flash process, undesirable voids may occur. This is due to an aspect ratio of the 90 nm flash process being rapidly increased to 1.93 despite that an aspect ratio of the 130 nm flash process is 1.05.

However, for a normal gap-fill without defects such as voids, the aspect ratio may be lowered by widening a space between gates or reducing thickness of spacers on both sides of the gates. If the spatial gap between the gates is increased, a breakdown voltage in a logic region requiring a high voltage is reduced, thereby causing problems such as reduced reliability in the cell region.

The thickness of the spacers may be reduced in order to reduce the aspect ratio between the gates. To further reduce the aspect ratio between the gates, the spacers can be etched. If the spacers are excessively etched, the thickness of the spacer in the logic region can be relatively reduced in order to reduce a channel length due to ion implantation. Thus, the breakdown voltage can be eventually lowered, resulting in problems to the device.

To reduce an aspect ratio, a spacer can be deposited having a thin thickness. If the thickness of the deposited spacer is thin, a breakdown voltage of the device may be lowered by subsequent ion implantation to reduce device reliability. Accordingly, after completion of ion implantation, a masking process may be additionally conducted in order to remove the spacer in the cell region, which increases fabricating costs.

SUMMARY

Embodiments relate to a method of fabricating a flash memory device that prevents void generation in a 90 nm or less flash memory to obtain an aspect ratio sufficient for gap-fill of a PMD layer without additional processes.

Embodiments relate to a method of fabricating a flash memory device including at least one of the following steps: forming a pair of stacked gates spaced apart over a cell region of a semiconductor substrate; forming a pair of first spacers over the cell region in direct contact with at least one side of the stacked gates; forming a pair of gate electrodes spaced apart over a logic region of the semiconductor substrate; forming a pair of second spacers over the logic region in direct contact with at least one side of the gate electrodes; coating a first photoresist layer over the cell area between the first spacers and a second photoresist layer over the logic area between the second spacers; hardening the first photoresist layer and the second photoresist layer; and reducing the initial thickness of the second photoresist layer using an etching process to a final thickness sufficient to protect the second spacers. In accordance with embodiments, the second photoresist layer is formed having a predetermined initial thickness sufficient to cover at least a portion of the second spacers.

Embodiments relate to a flash memory device including a cell region and a logic region formed over a semiconductor substrate; a pair of stacked gates formed spaced apart over the cell region; a pair of first spacers formed over the cell region in direct contact with at least one side of the stacked gates; a pair of gate electrodes formed spaced apart over the logic region; a pair of second spacers formed over the logic region in direct contact with at least one side of the gate electrodes; and a first photoresist layer formed over the cell area between the first spacers and a second photoresist layer formed over the logic area between the second spacers. In accordance with embodiments, the second photoresist layer has a predetermined thickness sufficient to protect the second spacers.

Embodiments relate to a flash memory device including a logic region provided over a semiconductor substrate; a pair of gate electrodes formed over the logic region; a pair of spacers formed over the logic region in direct contact with a respective one of the gate electrodes; and a photoresist layer formed between and in contact with the pair of spacers. In accordance with embodiments, the photoresist layer has a predetermined thickness sufficient to protect the second spacers.

DRAWINGS

Figure 2:
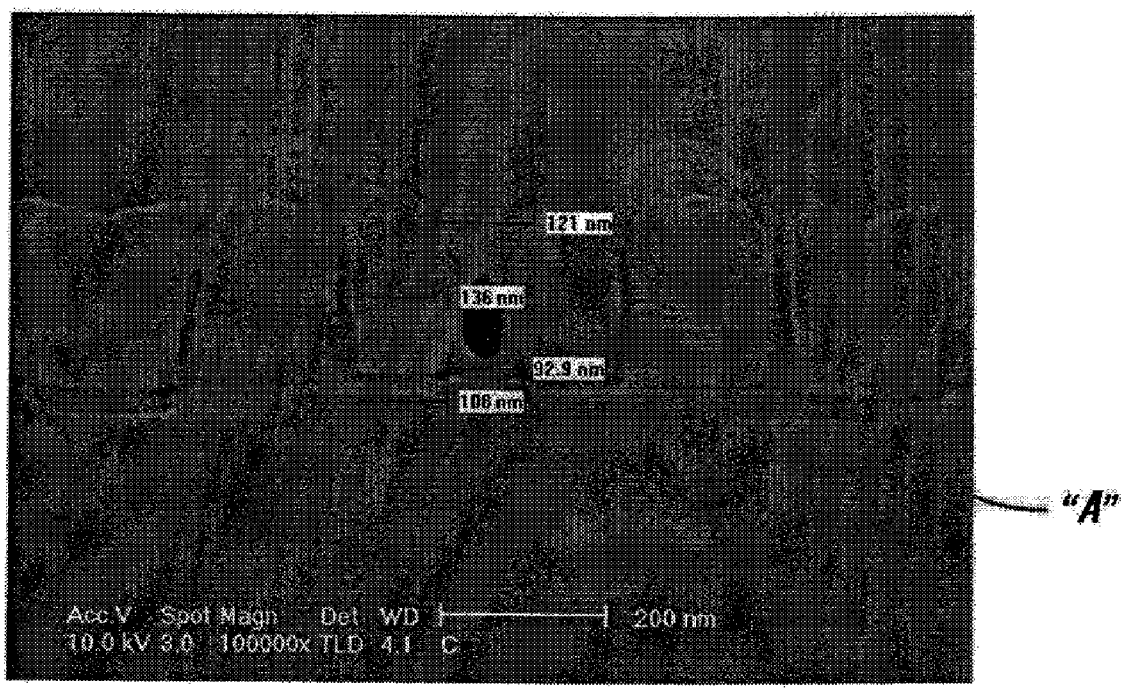

Example FIGS. 1 and 2 illustrate diagrams of a scanning electron microscope (SEM) image of a PMD deposition in a flash process.

Figure 3A:
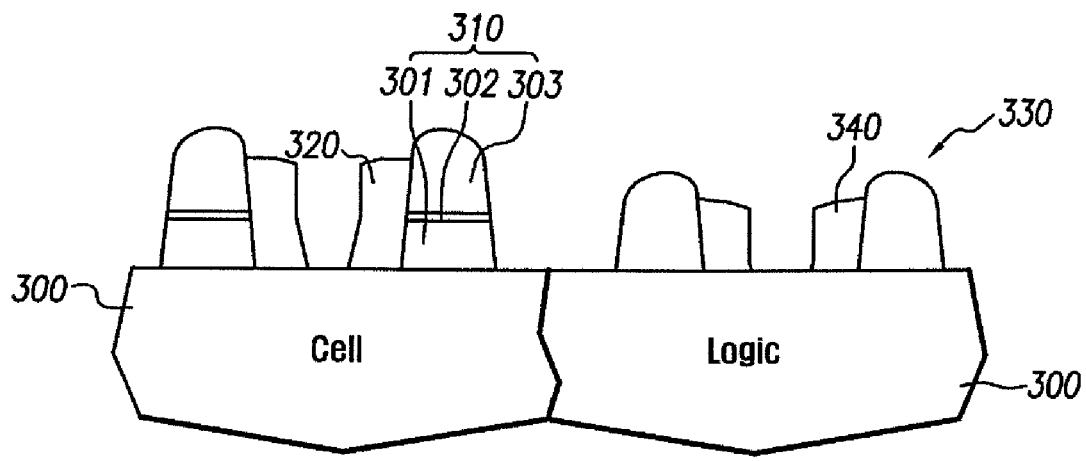
Figure 3B:
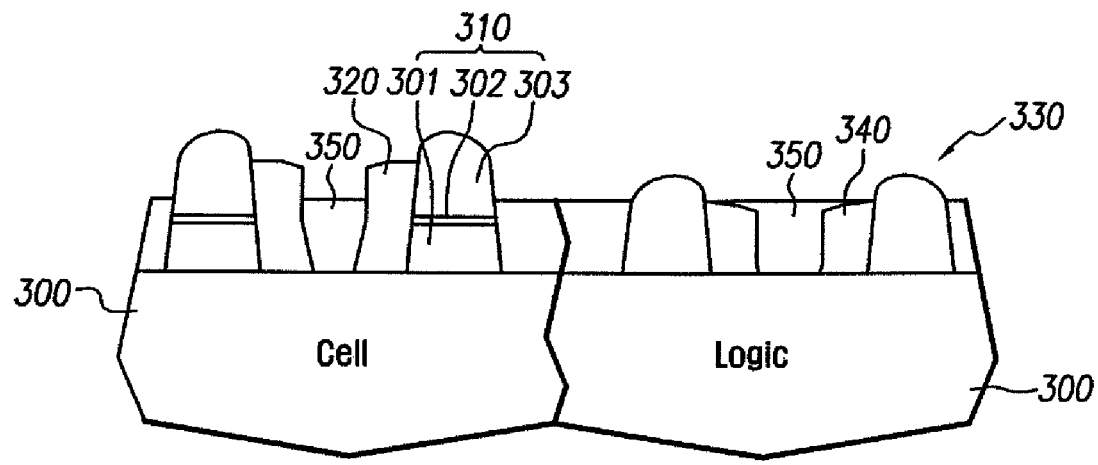
Figure 3C:
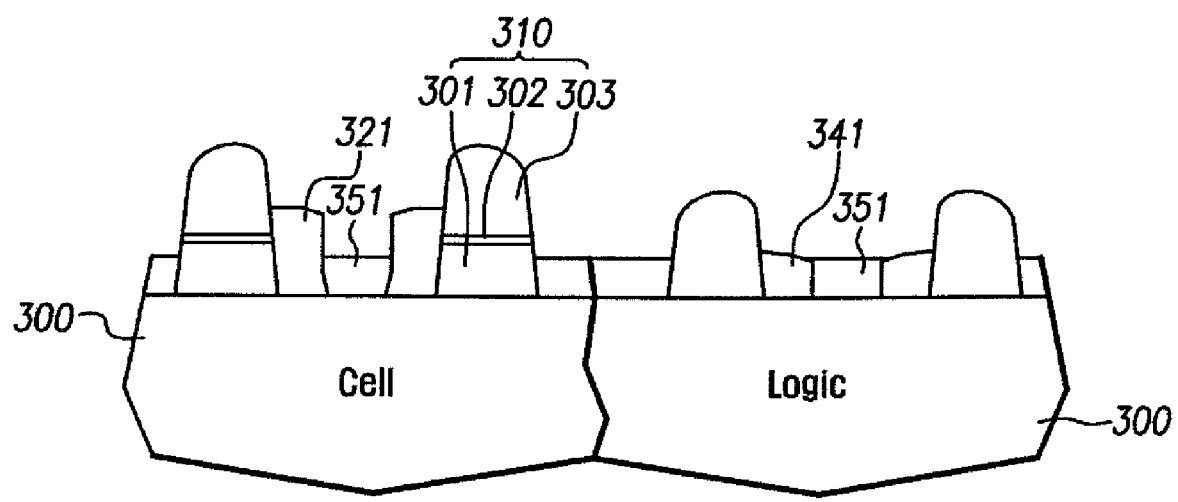

Example FIGS. 3A to 3C illustrate a method of fabricating a flash memory device, in accordance with embodiments.

DESCRIPTION

As illustrated in example FIG. 3A, a flash memory device in accordance with embodiments can include a cell region and a logic region provided on and/or over semiconductor substrate 300.

The cell region includes a pair of stacked gates 310 and a pair of first spacers 320 each provided adjacent to or in contact with at least one side of a respective stacked gate 310. Stacked gates 310 may include floating gate 301, ONO (oxide/nitride/oxide) layer 302 formed on and/or over floating gate 301, and control gate 303 formed on and/or over ONO layer 302.

The logic region can include a pair of gate electrodes 330 and a pair of second spacers 340 provided adjacent to or in direct contact with at least one side of a respective gate electrode 330.

As illustrated in example FIG. 3B, photoresist layer 350 can be coated on and/or over the cell region between first spacers 320 and the logic region between second spacers 340. Photoresist layer 350 provided on and/or over the cell region can have a predetermined thickness smaller than the thickness of first spacers 320. Photoresist layer 350 provided on and/or over the logic region can have a predetermined thickness sufficient to cover second spacers 340. Photoresist layer 350 can have a thickness of between approximately 1,500 to 2,000 Å. Covering second spacers 340 in the logic region sufficiently with photoresist layer 350 results in minimizing the loss of second spacer 340 during etching. Since an upper portion of first spacers 320 in the cell region is not covered by photoresist layer 350, the thickness of first spacers 320 can be reduced only by a subsequent etching step. Photoresist layer 350 can prevent a loss of a device isolation layer region etched by a subsequent etching step or prevent externally-caused damage.

After formation of photoresist layer 350, a hardening process can be carried out thereon. The hardening of photoresist layer 350 can be carried out at 250 to 300□ using thermal curing or UV irradiation.

As illustrated in example FIG. 3C, first spacers 321 can be etched to a thickness sufficient to protect second spacers 341. First spacers 321 can be etched using a blanket etching process under the following conditions. First, the blanket etch can be carried out for approximately 5 to 100 seconds by injecting between approximately 50 to 200 sccm $Cl_2$ gas, between approximately 10 to 100 sccm HBr gas, and between approximately 5 to 15 sccm $O_2$ gas at an ambient pressure of between approximately 50 to 200 mTorr, at a voltage of between approximately 50 to 500 W.

An upper portion of photoresist layer 351 can be etched during etching for reducing the thickness of first spacers 321. Photoresist layer 351 can be etched to a thickness sufficient to protect or otherwise cover second spacers 341. In this regard, photoresist layer 351 can be etched to a thickness of between approximately 500 to 1,500 Å. By reducing the thickness of first spacers 321, an aspect ratio can be reduced to between approximately 1:1 to 1.5:1.

After completion of the etching of first spacers 321 to reduce the aspect ratio, the remaining photoresist layer 351 can be removed using dry etching or wet etching. Subsequent steps for forming a PMD layer and the like can then be carried out.

In the process for forming a flash memory device of 90 nm or lower, the thickness of first spacers 321 can be reduced by etching first spacers 321 to a predetermined level sufficient to protect second spacers 341 in the logic region. Thus, the aspect ratio can be reduced, whereby the void generation problem can be solved in the PMD gap-filling process. It would also be unnecessary to add a prescribed mask process for removing spacers 341 contacting gates 341 in order to reduce the aspect ratio. Moreover, equipment invested for the PMD gap-fill process can become unnecessary, and thus, productivity can be considerably enhanced in aspect of cost-reduction.

In accordance with embodiments, a 90 nm or lower flash memory device can be formed having a cell region including a pair of stacked gates 310 and a pair of first spacers 321 each provided adjacent to or in contact with at least one side of a respective stacked gate 310. First spacers 321 can be etched to a thickness sufficient to protect second spacers 341 providing on and/or over the logic region. Thus, the aspect ration can be reduced by reducing the thickness of first spacers 321, thereby solving the void generation problem in a PMD gap-fill process.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a pair of stacked gates spaced apart over a cell region of a semiconductor substrate;
    forming a pair of first spacers over the cell region in direct contact with at least one side of the stacked gates;
    forming a pair of gate electrodes spaced apart over a logic region of the semiconductor substrate;
    forming a pair of second spacers over the logic region in direct contact with at least one side of the gate electrodes;
    coating a first photoresist layer over the cell area between the first spacers and a second photoresist layer over the logic area between the second spacers, wherein the first photoresist layer and the second photoresist layer are formed to a predetermined initial thickness which is smaller than the thickness of the first spacers but sufficient to cover at least a portion of the second spacers;
    hardening the first photoresist layer and the second photoresist layer; and then
    reducing the initial thickness of the second photoresist layer using an etching process to a final thickness sufficient to protect the second spacers, wherein the thickness of the first spacer is reduced during the etching process, and wherein an upper portion of the first photoresist layer is etched during the etching process.

2. The method of claim 1, wherein the first photoresist layer and the second photoresist layer each have predetermined initial thickness of between approximately 1,500 to 2,000 Å.

3. The method of claim 1, wherein the first photoresist layer and the first photoresist layer are hardened using at least one of thermal curing and UV irradiation.

4. The method of claim 3, wherein the at least one of thermal curing and UV irradiation is conducted at a temperature of between approximately 250 to 300° C.

5. The method of claim 1, wherein reducing the thickness of at least one of the first spacer and the second photoresist layer is conducted using a blanket-etch for between approximately 5 to 100 seconds.

6. The method of claim 5, wherein reducing the thickness of at least one of the first spacer and the second photoresist layer is conducted using a blanket-etch by injecting between approximately 50 to 200 sccm Cl2 gas, between approximately 10 to 100 sccm HBr gas, and between approximately 5 to 15 sccm O2 gas at an ambient pressure.

7. The method of claim 6, wherein reducing the thickness of at least one of the first spacer and the second photoresist layer is conducted using a blanket-etch at between approximately 50 to 200 mTorr and between approximately 50 to 500 W.

8. The method of claim 1, wherein after the etching process the final thickness of the second photoresist layer is between approximately 500 to 1,000 Å.

9. The method of claim 1, wherein the stacked gates comprise a floating gate, a dielectric layer formed over the floating gate and a control gate formed over the dielectric layer.

10. The method of claim 9, wherein the dielectric layer comprises an ONO layer.

11. An apparatus comprising:
   a cell region and a logic region formed over a semiconductor substrate;
   a pair of stacked gates formed spaced apart over the cell region;
   a pair of first spacers formed over the cell region in direct contact with at least one side of the stacked gates;
   a pair of gate electrodes formed spaced apart over the logic region;
   a pair of second spacers formed over the logic region in direct contact with at least one side of the gate electrodes; and
   a first photoresist layer formed over the cell area between the first spacers and a second photoresist layer formed over the logic area between the second spacers, wherein the first photoresist layer and the second photoresist are formed to a predetermined initial thickness which is smaller than the thickness of the first spacers but sufficient to cover the second spacers,
   wherein the second photoresist layer has a predetermined final thickness sufficient to protect the second spacers.

12. The apparatus of claim 11, wherein the second photoresist layer is etched to obtain the predetermined final thickness.

13. The apparatus of claim 12, wherein the predetermined final thickness is between approximately 500 to 1,500 Å.

14. The apparatus of claim 11, wherein the first photoresist layer and the first photoresist layer are hardened using at least one of thermal curing and UV irradiation.

15. The apparatus of claim 14, wherein the at least one of thermal curing and UV irradiation is conducted at a temperature of between approximately 250 to 300° C.

16. The apparatus of claim 11, wherein the stacked gates comprise a floating gate, a dielectric layer formed over the floating gate and a control gate formed over the dielectric layer.

17. The apparatus of claim 16, wherein the dielectric layer comprises an ONO layer.

* * * * *